United States Patent [19]
Davis et al.

[11] Patent Number: 5,280,414
[45] Date of Patent: Jan. 18, 1994

[54] AU-SN TRANSIENT LIQUID BONDING IN HIGH PERFORMANCE LAMINATES

[75] Inventors: Charles R. Davis, Endicott; Richard Hsiao, Vestal; James R. Loomis, Binghamton; Jae M. Park, Somers; Jonathan D. Reid, Johnson City, all of N.Y.

[73] Assignee: International Business Machines Corp., Armonk, N.Y.

[21] Appl. No.: 536,145

[22] Filed: Jun. 11, 1990

[51] Int. Cl.$^5$ .................. H05K 3/36; H05K 1/11; B32B 31/00

[52] U.S. Cl. .................. 361/795; 29/830; 156/252; 174/255; 174/256; 174/257; 174/258; 361/777; 361/778; 428/901

[58] Field of Search ............ 361/410, 414, 412, 795; 174/257, 258, 259, 262, 263, 264, 265; 29/827, 830, 831; 156/252; 228/180.1, 180.2, 121; 428/901

[56] References Cited

U.S. PATENT DOCUMENTS

| | | | |
|---|---|---|---|
| 3,417,461 | 12/1968 | Wells et al. | 29/487 |
| 3,648,357 | 3/1972 | Green, Jr. | 29/502 |
| 3,660,726 | 5/1972 | Ammon et al. | 361/414 |
| 3,678,570 | 7/1972 | Paulonis et al. | 29/498 |
| 3,922,777 | 12/1975 | Weitze et al. | 361/414 |
| 3,993,238 | 11/1976 | Brook et al. | 228/198 |
| 4,157,932 | 6/1979 | Hirata | 174/259 X |
| 4,727,633 | 3/1988 | Herrick | 228/122 |
| 4,788,766 | 12/1988 | Burger et al. | 29/830 |
| 4,875,617 | 10/1989 | Citowsky | 228/180.2 |
| 4,935,584 | 6/1990 | Boggs | 174/262 |
| 4,965,702 | 10/1990 | Lott et al. | 361/414 X |
| 4,998,665 | 3/1991 | Hayashi | 228/180.1 |
| 5,008,997 | 4/1991 | Phy | 29/827 |
| 5,031,308 | 7/1991 | Yamashita et al. | 174/259 X |
| 5,038,996 | 8/1991 | Wilcox et al. | 228/121 |
| 5,090,609 | 2/1992 | Nakao et al. | 228/180.2 |

FOREIGN PATENT DOCUMENTS

| | | | |
|---|---|---|---|
| 3316017 | 8/1984 | Fed. Rep. of Germany | 361/412 |
| 0110635 | 1/1989 | Japan. | |
| 1204052 | 9/1970 | United Kingdom. | |

OTHER PUBLICATIONS

R. J. Klein Wassink, *Soldering in Electronics*, 2nd Edition (Electrochemical Publications Limited, 1989) p. 543.

"Brazing by the Diffusion Controlled Formation of a Liquid Intermediate Phase", Lynch et al, pp. 85s–89s, Welding Journal Feb. 1959.

IBM Technical Disclosure Bulletin, vol. 25, No. 12, pp. 6380–6385, May, 1983, Ainslie et al, "Method of Joining Using Gold-Rich Braze Alloys In Conjunction With Thick Gold-Plated Surfaces".

Primary Examiner—Leo P. Picard
Assistant Examiner—Donald A. Sparks
Attorney, Agent, or Firm—Bernard Tiegerman; Judith D. Olsen

[57] ABSTRACT

A method is disclosed of simultaneously laminating circuitized dielectric layers to form a multilayer high performance circuit board and making interlevel electrical connections. The method selects two elements which will form a eutectic at one low temperature and will solidify to form an alloy which will only remelt at a second temperature higher than any required by any subsequent lamination. The joint is made using a transient liquid bonding technique and sufficient Au and Sn to result in a Au-Sn20wt% eutectic at the low temperature. Once solidified, the alloy formed remains solid throughout subsequent laminations. As a result, a composite, multilayer, high performance circuit board is produced, electrically joined at selected lands by the solid alloy.

6 Claims, 6 Drawing Sheets

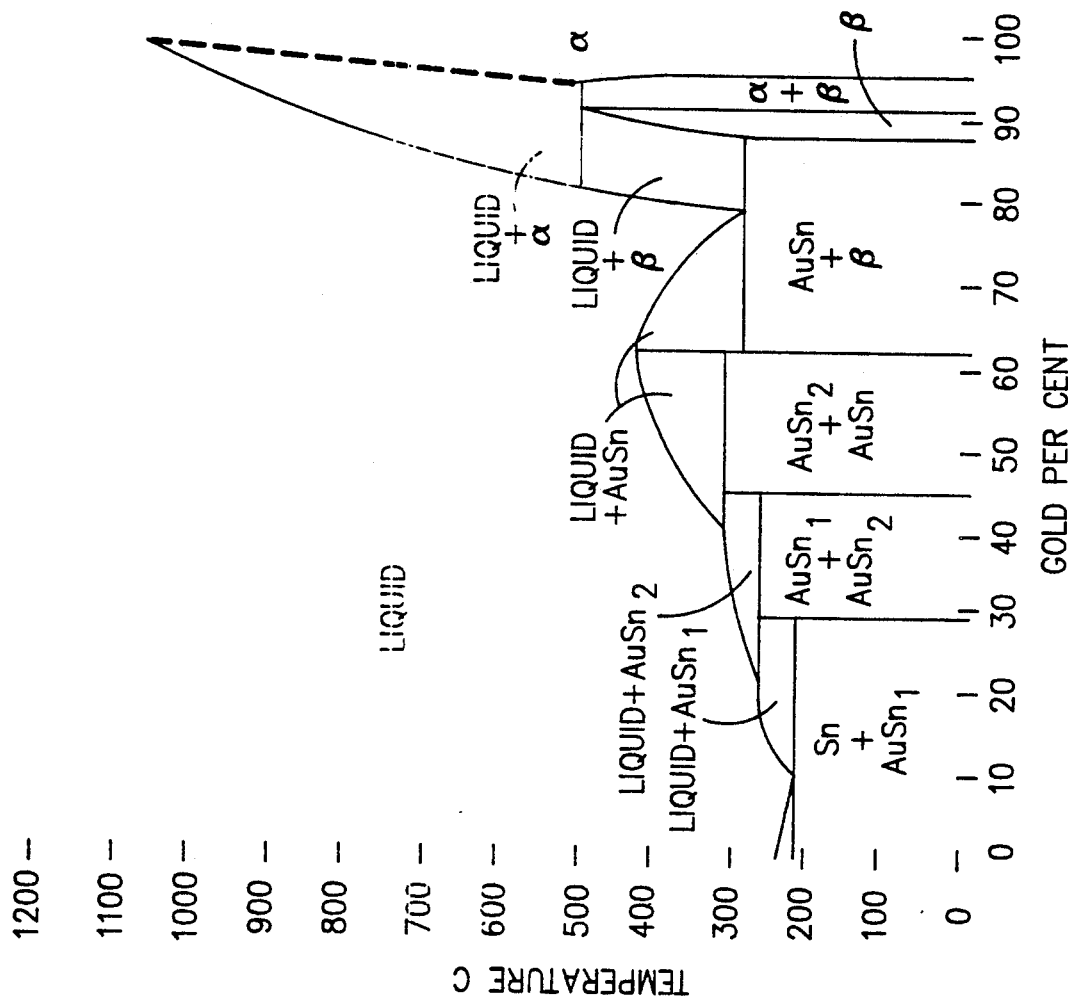

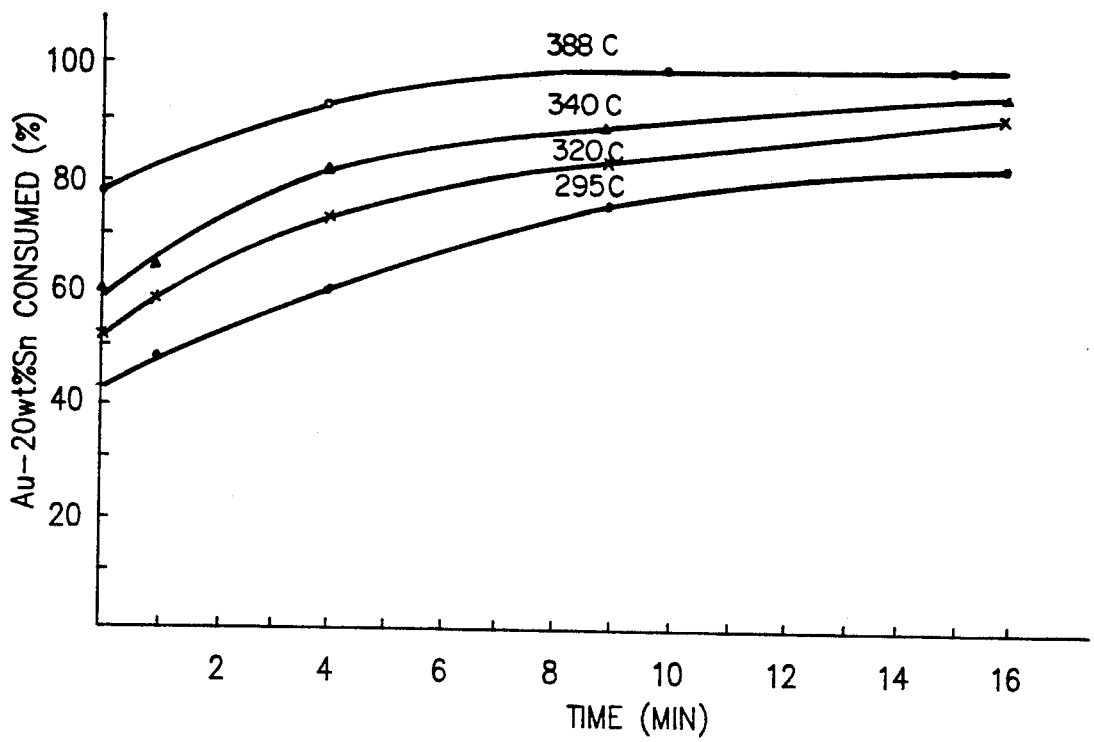
FIG.4
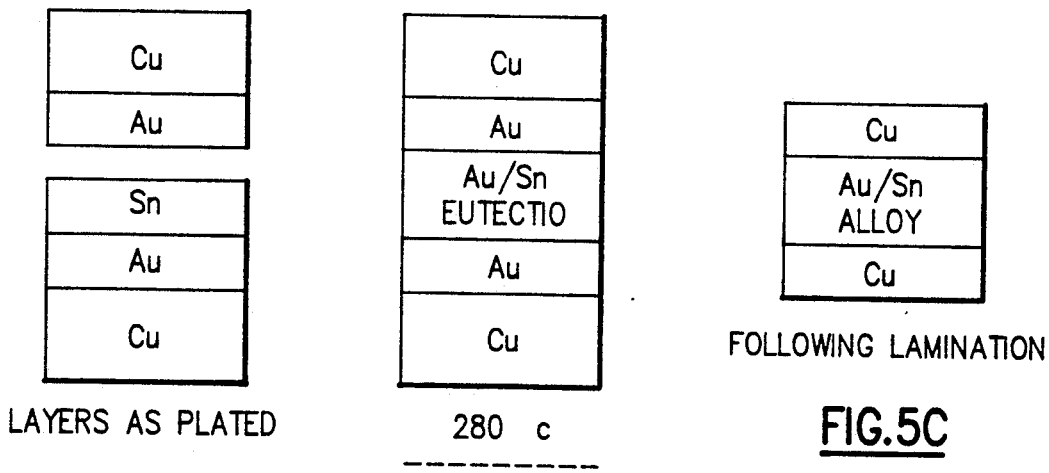
FIG.5A LAYERS AS PLATED
FIG.5B 280 c BRING INTERFACES TOGETHER
FIG.5C FOLLOWING LAMINATION

AU-SN TRANSIENT LIQUID BONDING IN HIGH PERFORMANCE LAMINATES

FIELD OF THE INVENTION

The present invention relates to high density printed circuit board (PCB) composites, and more particularly relates to a method of making electrical interconnections between laminated layers of the composite.

BACKGROUND OF THE INVENTION

The performance of high speed computers increasingly demands higher performance packaging and interconnection methods, from the printed circuit board (PCB) level on up. As semiconductor devices are developed to be operated with higher frequencies and shorter rise-times, the properties of the PCB substrates become more important.

In order to build working high density laminated PCBs, it is necessary to employ high performance polymers as the dielectric material. The high performance polymers are those which have very low dielectric constants, typically below 3 and even below 2, in order to permit higher line densities without causing shorting, electromagnetic inductance or crosstalk between conductors. They also require lamination temperatures higher than those required by higher dielectric polymers, such as epoxy, which requires a laminating temperature of about or below 200 degrees C. Among these high performance polymers are fluorocarbon polymers, such as PTFE (polytetrafluorethylene), PFA (PTFE and perfluoroalkoxy vinyl ether copolymer), polyimides, fluorinated polyimides, fluorinated cyanate esters, polysiloxane imioles, and polyphenyl quinoxilines. In order to electrically interconnect levels of circuitry in the Z-direction, i.e. in the direction normal to the plane, metallized through holes and vias are conventionally formed therebetween.

The term via is used when the opening terminates internally in a laminate layer, such as at a ground plane; the term through hole is used when the penetration continues to the opposite surface. For present purposes the term through hole will be used to encompass both through holes and vias.

As the required wiring density of higher performance printed circuit boards increases, the number of signal layers in the structure increases. Consequently, the number of interconnections between signal layers also significantly increases. The number of interconnections between signal layers is too high to be accommodated by conventional plated through hole (PTH) techniques. The limitation is due to the difficulties in drilling smaller holes, i.e. smaller than 6 mil, and plating in high aspect ratio holes (ratio of length to diameter).

It is clear therefore that the complexity of multilayer structures required for both first and second level high density packages cannot be achieved by conventional PCB or MLC (multilevel ceramic) technologies due to the process limitations of the conventional methods. A new method of interconnection other than soldered, plated through holes or screened vias is required.

Development of a parallel process, i.e. simultaneous lamination and interconnection, enables the fabrication of the multilayer structures by combining subunits or building blocks built, tested and repaired separately. The possibility of testing and repair of the subunits will greatly enhance overall product yield. Parallel processing is also very attractive in terms of shortened process time, and consequent overall cost savings.

While the concept of parallel processing typically either by parallel plates or by vacuum lamination is very attractive, it demands a new method of achieving electrical interconnections, often having high current carrying capabilities. One way of achieving interconnection is to prepare an eyelet shaped conductive pad called a land. As used in the practice of the present invention, the land provides a place where electrical contact can be made to a corresponding land at the surface of a second dielectric layer to which the first is to be laminated. In order to electrically connect two pads, conventional soldering may be an acceptable means in some situations. For example, a solder can be applied to the pads by an appropriate method, such as screening or plating, and reflowed during lamination. When the pads are connected to metallized holes, it is also possible to fill the holes with a solder. However, in high density packaging, with advanced dielectric materials, the use of such a solder is inadequate for making the land-to-land electrical contact. To give an example of the dimensions involved, in one high density package, Cu line thickness is 8 microns. It is 250 microns between lands. There are either one or two lines between lands, and the linewidth is either 25 microns or 50 microns. The closeness of adjacent lands and their small dimensions present the potential for solder bridging, shorting between the pads caused by the melted solder squeezed out during lamination. The problem is exacerbated by the fact that the laminated layers can be built up successively to fifty or more layers, with repeated soldering followed by repeated lamination under heat and pressure. Each time the lamination would occur, solder would reflow, and the opportunity for bridging would be presented anew.

Transient liquid bonding (TLB) is a diffusion bonding technique which involves depositing on different conductive surfaces metals which together are capable of forming a eutectic melt. The surfaces to be bonded must be comprised of a highly conductive material such as copper, and are coated with the metals, brought into physical contact with one another and are heated above the eutectic temperature to form a melt. Solidification of this thin, liquid region bonds the metallic surfaces together. Recent work, such as described in copending U.S. Ser. No. 382,073, "Bonding of Metallic Surfaces" to Wilcox et al, filed Jul. 17, 1989, a continuation of U.S. Ser. No. 256,534, now abandoned, filed Oct. 12, 1988, commonly assigned to the present assignee, has applied the techniques of transient liquid bonding to connect the copper terminal pins of surface mounted semiconductor devices to copper lands on a second level electronic package such as a printed circuit board or card. Since the TLB process does not require the use of flux and uses minimal amounts of solder, bridging is reduced as compared to conventional soldering. A solder which, having formed a eutectic melt at a low temperature, would solidify to form an alloy which would not then melt until a temperature is reached that is higher than temperatures required in subsequent device processing, without forming brittle intermetallics in the process, would provide many advantages over known techniques. If the soldering could be performed simultaneously with the lamination of the multilayer high performance board, the joining would be a more efficient and reliable process than heretofore.

SUMMARY OF THE INVENTION

The present invention is concerned with interconnecting laminated layers within the high density PCB. In particular, as depicted in FIG. 11, the present invention is concerned with bonding the metallic lands 35, 45 at a surface of a first dielectric laminate 20 with corresponding lands 65, 75 on a surface of a second dielectric laminate 50, while at the same time bonding together the two dielectric laminates 20 and 50. This procedure is repeated until the number of laminates desired is cojoined to form a composite, or preferably all the layers or subunits are stacked and joined at once. In either case, each time the process is repeated, the underlying laminates are exposed to the temperature and pressure cycles required by the particular polymer of the laminate to effect a secure composite.

High performance polymers may call for a lamination temperature of about 390 degrees C., as in the case of PTFE. A temperature of 390 degrees C. is above the melting point of conventional PbSn solder, the melting point of which is about in the range of 183-320 degrees C. A SnPb solder will be subject to remelt each time a lamination is performed. Not only does the thermal cycling present a repeated risk that the remelted solder will bridge, but the risk is also presented that with each cycle, more and more copper from the land will be dissolved into the solder to form brittle intermetallics, degenerating the integrity of the connection. Of course, the risk of bridging is particularly acute at the close dimensions of the high density PCB.

It is therefore an object of this invention to provide a method for electrically interconnecting laminate layers at designated lands of a multilayer high performance laminated composite.

It is a further object of the invention to provide a method for electrically interconnecting laminate layers at designated lands of a multilayer high performance PCB reliably, despite subsequent lamination procedures.

It is a further object of the invention to provide a method of simultaneously electrically interconnecting laminate layers at designated lands of a multilayer high performance PCB and laminating together at least two levels of high performance dielectric layers.

With reference again to FIG. 11, these and other objects of the present invention are achieved by using a transient liquid bonding technique wherein one metal, such as gold, is deposited on a land, e.g., lands 35 and 45 and another metal, such as tin, is deposited on the corresponding land, e.g., lands 65 and 75, with which it is to be connected. The choice of the metals is determined by the following requirement: When the metal coated lands 35, 45, 65 and 75 are contacted and first heated to a melting temperature that is both at least slightly above that which is necessary to form a binary eutectic solder composition and then is heated up to the processing temperature of the particular dielectric polymer system involved, the non-eutectic solder alloy composition resulting upon solidification will remain solid throughout subsequent dielectric processing temperatures. The solid, non-eutectic solder alloy will also, of course, remain solid throughout the composite in the event a semiconductor chip device 100 is solder mounted thereon, via solder bulls 110. The metallurgical joints 80, 90 connecting the individual polymer layers of the composite should not remelt during chip joining which, in the typical controlled collapse chip connection (C4) process, takes place at a peak temperature of about 360 degrees C.

BRIEF DESCRIPTION OF THE DRAWINGS

Other objects and advantages of the present invention will be apparent from the following descriptions and the drawings, in which:

FIG. 4 shows the percentage of the Au-20wt%Sn eutectic reacted v. time at four different temperatures.

FIG. 5a shows schematically the metal coated lands before and 5b initially after bonding. 5c shows the lands after completion of the lamination.

DESCRIPTION OF THE PREFERRED EMBODIMENTS

Figure 11:
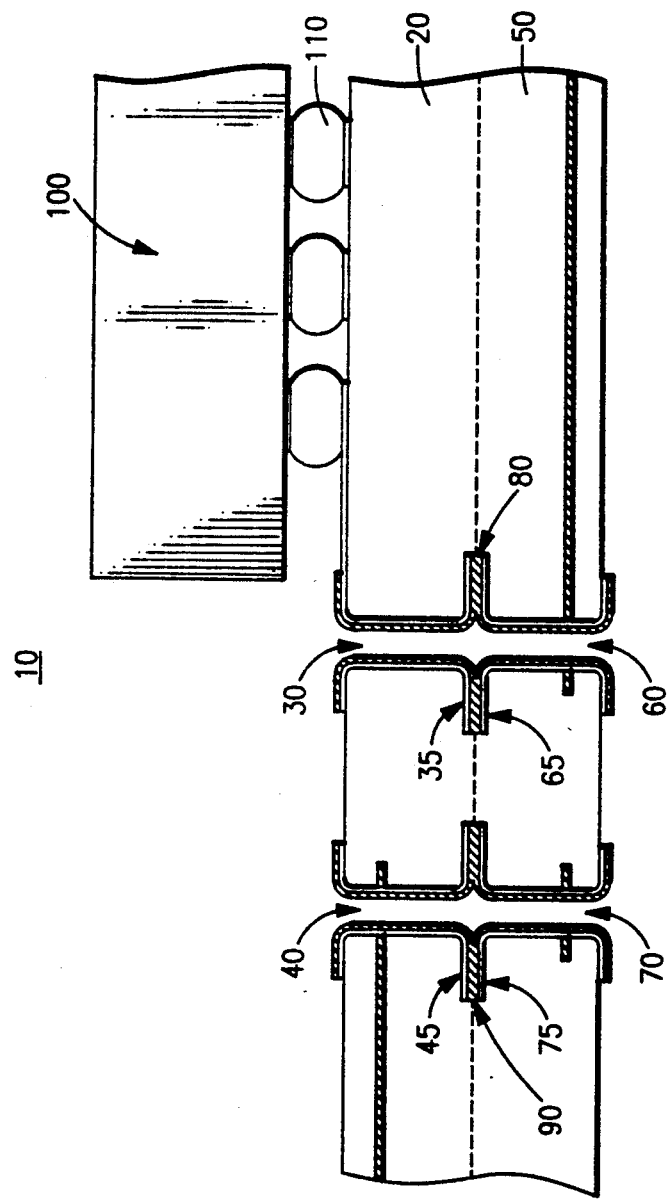
FIG. 11 is a cross-sectional view of a printed circuit board, including just two laminated dielectric layers, produced in accordance with the inventive process.

With reference yet again to FIG. 11, in the preparation of high performance circuit boards 10, discrete circuitized low dielectric polymer layers 20, 50 made, for example, of PTFE, optionally including also reinforcement and filler material, are laminated at about 390 degrees C. and about 500 psi. In the present invention the electrical interconnections between the circuitized layers are achieved by joining the lands 35, 45 and 65, 75 of the metallized through holes 30, 40 and 60, 70 in the separate dielectric layers 20 and 50 simultaneously during lamination under the extreme laminating conditions required by the high performance polymer. To accomplish the joining, a metallurgical system must be chosen whose initial melting point is below the laminating temperature, but increases during exposure to the temperatures of the lamination so that the final melting point is significantly higher than the peak laminating temperature. The laminating temperature is determined by either the glass transition temperature or by the melting point of the particular polymer. This joining was achieved by reacting two metals with differing melting points. In such a process, the bonding temperature is above the melting point of the lower melting point metal and the eutectic, the reaction of forming a eutectic proceeding through wetting the lands 35, 45 and 65, 75 and subsequent interdiffusion of the two metals to form homogenous joint compositions. As a result of the reaction, the melting point of the joints, 80 and 90 are is raised and a solid joints 80 and 90 is achieved. The joint thus formed will not melt again when reheated to at least the laminating temperature of the particular dielectric polymer.

Several metals systems were tried on the basis of their phase diagrams. Copper and tin were one candidate pair of metals. By alloying Cu and Sn to form bronze, the melting point is raised from the melting point of tin (232 degrees C.) to above 800 degrees C. However, Cu and Sn when first reacted form a CuSn intermetallic which is extremely brittle, and so this metal pair was rejected.

Of several systems evaluated, including PbSn, AuSn, AuAu and CuSn, only AuSn satisfied all requirements. It is known that if the AuSn alloy system were too tin rich, i.e. greater than about 20wt.% tin, the bond tends to be brittle. Generally, the ratio of Au/Sn should be at least equal to about 1.5. AuSn20wt.% eutectic melts at about 280 degrees C. By reacting it with Au the melting point is raised to above about 490 degrees C. The resulting composition has the ductility and strength required to maintain joint integrity even when reheated to high performance polymer laminating temperatures.

Figure 1:
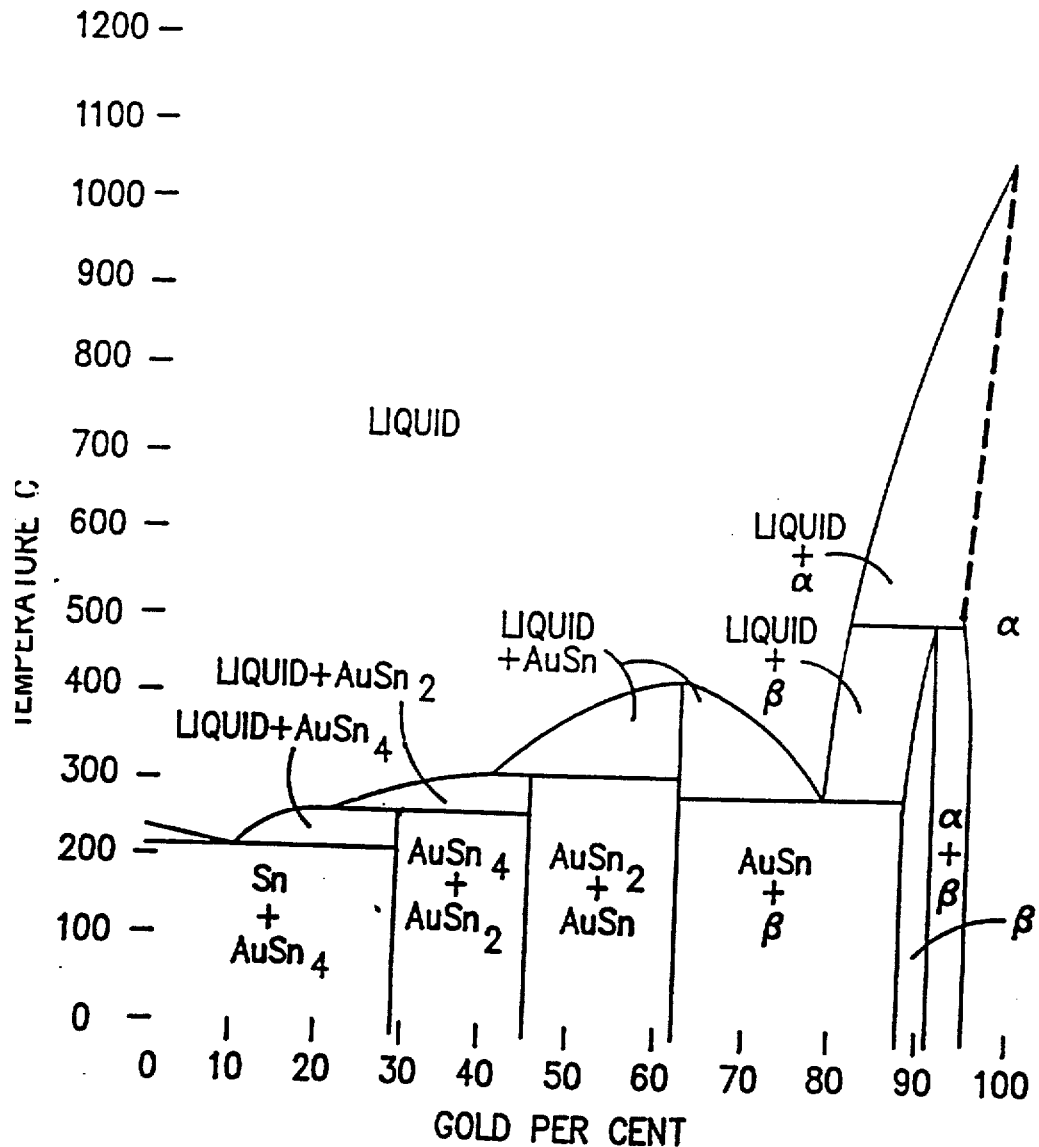
FIG. 1 shows the known Au-Sn phase diagram.

From the AuSn phase diagram, shown in FIG. 1, it can be seen that several AuSn intermetallics may form when gold and tin are in contact. With the solid Sn (with some Au dissolved), and solid Au (with some Sn dissolved), these four intermetallics can form different eutectic and peritectic systems. Because these phases and systems are the equilibrium ones, however, they may not occur when Au and Sn are heated up. The phases actually formed during heating will be determined by the kinetics of the reaction. Experiments were run on copper coupons to simulate the joining of copper lands in the laminate. The kinetics was studied using samples with three different initial Au and Sn thicknesses, called group A, group B and Group C. For group A samples, 5 microns of gold and 2 microns of tin (nominal) were plated sequentially on Cu foil coupons; for group B samples 3 microns of gold and 2 microns of tin (nominal) were plated sequentially on Cu foil coupons. (Actually, DSC measurements showed the Sn in group B samples to be closer to 1.3 microns.) For group C samples, 20 microns of gold and 3 microns of tin (nominal) were plated sequentially on copper foil coupons.

Plated coupons of groups A and B were laminated at 390 degrees C. for 30 minutes at a pressure of 500 psi to copper foil coupons plated with 3 microns gold. Prior to gold plating the copper surfaces had been etched with sodium persulfate and dipped into 10% sulfuric acid for cleaning. The gold plating was carried out at a current density of 10.3 mA/cm2. A cyanide gold salt bath containing 32 grams/liter gold metal was adjusted to a pH of 5.5 with citrate and phosphate buffer salts and was operated at 135 degrees F. Under these conditions the bath operated at 99% current efficiency and yielded a gold deposit of 60–90 Knoop hardness.

Tin was plated from a stannous sulfate (15 g/l Sn)/sulfuric acid (10% vol.) bath at a current density of 10.5 mA/cm2. There was no pretreatment of the gold surface prior to plating tin.

Coupons of 3/16" diameter were punched out from the foil for the heat treatment and DSC measurement. A Perkin-Elmer Differential Scanning Calorimeter was used to measure the endotherm due to the melting of the alloy in a nitrogen atmosphere.

Figure 2:
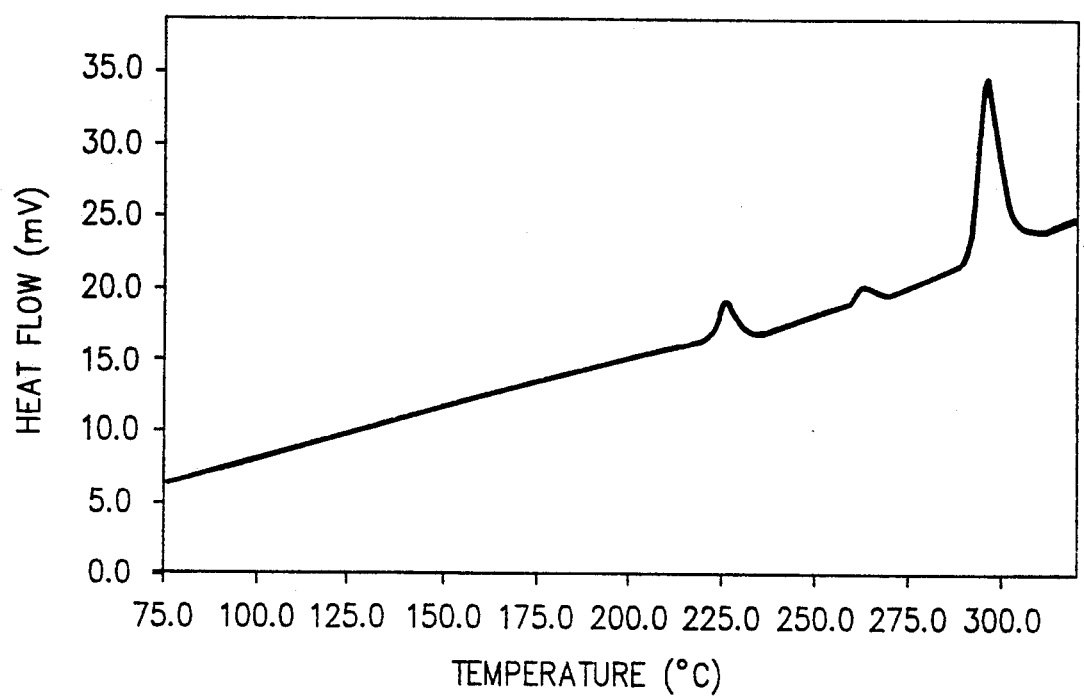
FIG. 2 shows a Differential Scanning Calorimetric (DSC) thermogram in which is apparent three thermograms, corresponding to three stages in the AuSn state as the temperature is increased at a constant rate.

FIG. 2 shows a DSC thermogram of a group C sample heated at a rate of 100 degrees C./min up to 320 degrees C. Three endotherms, which occurred at 218 degrees C., 257 degrees C., and 287 degrees C., are apparent in the thermogram. These endotherms corresponded to:

the eutectic reaction, $Sn + AuSn_4 \rightarrow L$, at 217 degrees C.;

the peritectic reaction, $AuSn_4 \rightarrow AuSn_2 + L$, at 252 degrees C; and the eutectic reaction, $AuSn + beta \rightarrow > L$, at 280 degrees C.

Any discrepancies in the measured melting point and the ones in the phase diagram were most likely due to the thermal lag associated with the fast heating rate.

The above results showed that at a heating of 100 degrees C./minute, four possible intermetallics formed. The four intermetallics and Sn then formed two eutectic systems and one peritectic system, as mentioned above. The peritectic reaction at 309 degrees C. was not observed. No endotherm at the melting point of pure Sn, 232 degrees C., was detected, indicating that Sn had reacted completely with Au.

Figure 3:
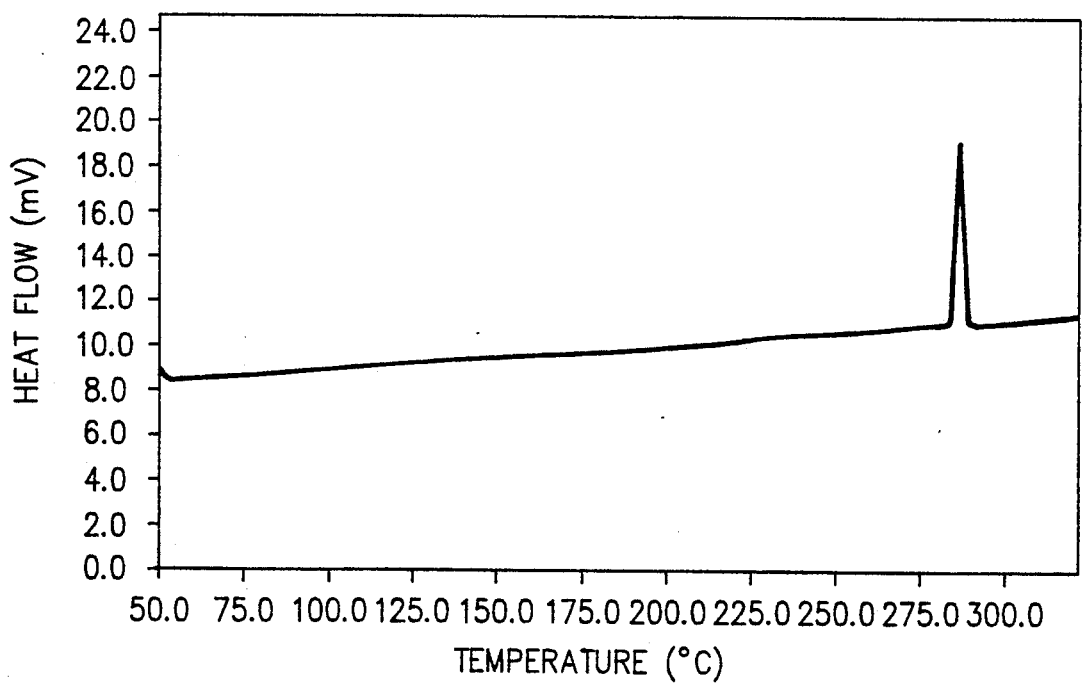
FIG. 3 shows a DSC at a slower heating rate than seen in FIG. 2.

When the heating rate was lowered, the endotherms corresponding to the reaction at 217 degrees C. and 252 degrees C. became less pronounced. At heating rates at and below 20 degrees C./minute, the only endotherm observed was from the eutectic reaction, $AuSn + beta \rightarrow > L$, shown in FIG. 3.

To characterize the reaction quantitatively, the heat of fusion of Au-20wt%Sn eutectic was measured using commercially available preforms. The heat of fusion was determined to be 27 J/g. It was calculated that 4.5 microns of Au would be needed to react with the 3-micron-plated Sn if, as preferred, the Au-20wt%Sn eutectic were to be the only product, a ratio of 1.5 microns Au/micron Sn. For the sample used in this study, the weight of the resulting eutectic would then be 1.95 mg. The product of this weight and the heat of fusion was 52.1 mJ. The measured endotherm averaged from 15 samples was found to be 53.7 mJ with a standard deviation of 3.5 mJ, which agreed with the calculated value very well. The result confirmed that at a only reaction product.

After the Au-20wt%Sn eutectic is formed, it may react with the Au underneath further to form either a beta phase or an AuSn solid solution before it melts. To characterize this reaction, samples were heated at rates from 3 to 100 degrees C./min. and the endotherm at 280 degrees C. was measured. The results showed that the solid state reaction between the Au-20wt%Sn eutectic and the remaining Au was insignificant in the given heating rate range. The reaction between the liquid Au-20wt%Sn eutectic and the solid Au for different temperatures was also studied and plotted in FIG. 4. In this set of experiments, the samples were first heated at 100 degrees C./min. to 250 degrees C. and then at 20 degrees C./min. to different temperatures for different lengths of time, cooled down at 100 degrees C./min. to 250 degrees C., and then heated at 20 degrees C./min. to 300 degrees C. again. The extent of the reaction was determined by comparing the endotherms at 280 degrees C. in the first and the second heating run.

FIG. 4 shows the percentage of the Au-20wt%Sn eutectic reacted versus time at four different temperatures. These data indicated that the initial reaction between liquid eutectic and Au was very fast; upon heating up to 295 degrees C., about 40% eutectic, corresponded to about 3 microns, had already reacted with Au. After the initial reaction, the reaction became slower. At 390 degrees C., it took about 10 minutes to complete the reaction.

As the reaction proceeded the peak temperature of the original eutectic melting was found to remain as a constant in the subsequent heating. When kept at a specific temperature, the composition of the remaining liquid was at the value defined by the liquidus in the phase diagram. However, upon cooling down, the liquid composition changed along the liquidus and reached the eutectic composition again.

Schematically, FIG. 5a shows the metallized lands before and FIG. 5b after joining by TLB. The structure in 5b remains the same after repeated lamination cycles, except that as seen in 5c, additional amounts of gold are dissolved from the lands into the AuSn eutectic.

Figure 6:
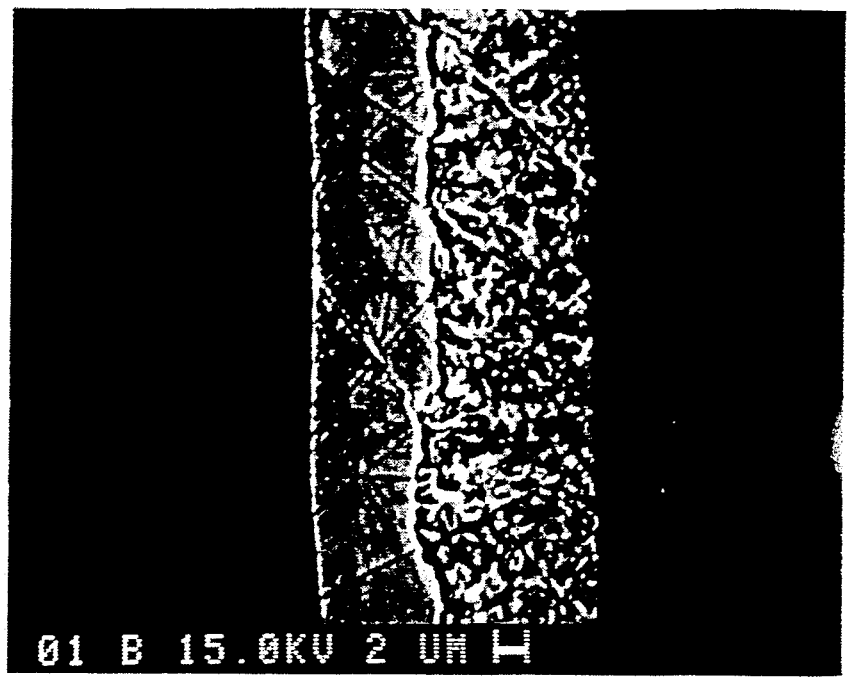
FIG. 6 shows AuSn eutectic partially reacted with Au.

The reaction between the liquid AuSn20wt.% eutectic and the Au was studied for different temperatures. FIG. 6 is an SEM photo of a sample in which Au-20wt%Sn eutectic has partially reacted with Au. The sample was cross-sectioned and etched with Technistrip, a cyanide-containing solution commonly used in Au etching. The micrograph was taken using back-scattered electrons. The contrast used to reveal the layers in the Au-Sn section made the Cu foil invisible in the micrograph. Three distinct layers can be seen in FIG. 6. The layer on the right is the unreacted Au. The dark line and the bright line between the Au and the middle layer was believed to be due to a ledge caused by etching. An energy dispension spectrometric analysis showed that the layer on the left had a composition close to 80 wt % Au, which confirmed the speculation from the DSC results that the unreacted liquid AuSn remained at the eutectic composition. The middle layer was found to have a composition close to that of beta phase. Therefore, it was concluded that above its melting point, AuSn eutectic reacted with Au to form beta phase Au5Sn. The photo also showed that the reaction proceeded by growth of the zeta phase into the eutectic. The figures indicate that the joining was complete.

Figure 7:
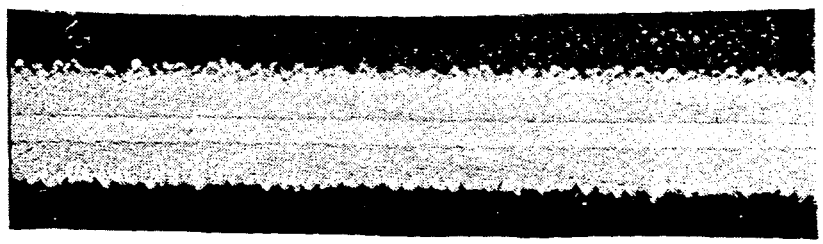
FIG. 7 is an Scanning Electron Micrograph (SEM) of a group A sample bonded to a coating of 3 microns of Au on a Cu foil coupon. (Group A samples were sequentially plated with 5 microns of gold and 2 microns of tin—nominal.)
Figure 8:
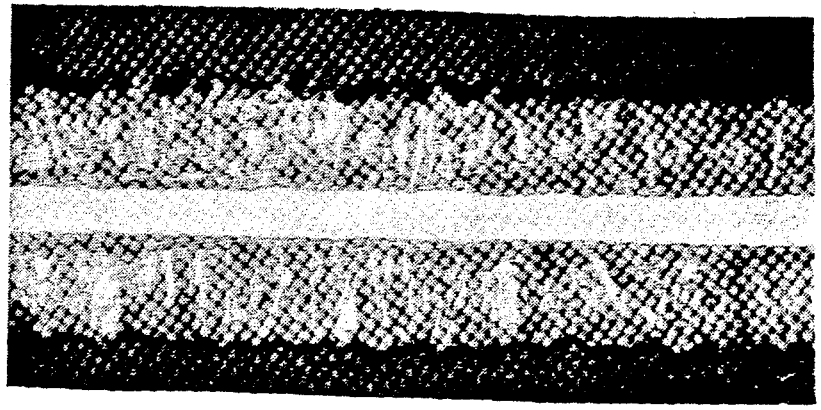
FIG. 8 is an SEM of a group B sample bonded to a coating were sequentially plated with 3 microns of Au and 1.3 microns of Sn—nominal.
Figure 9:
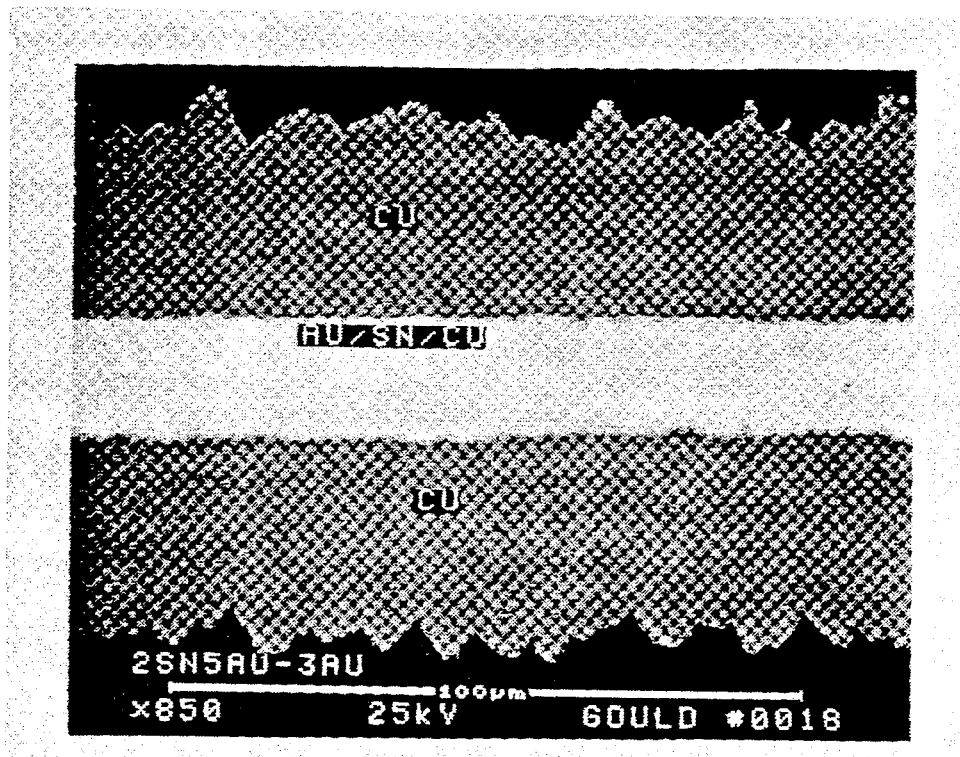
FIG. 9 is a Backscattered Electron (BSE) image of the FIG. 8 sample.
Figure 10:
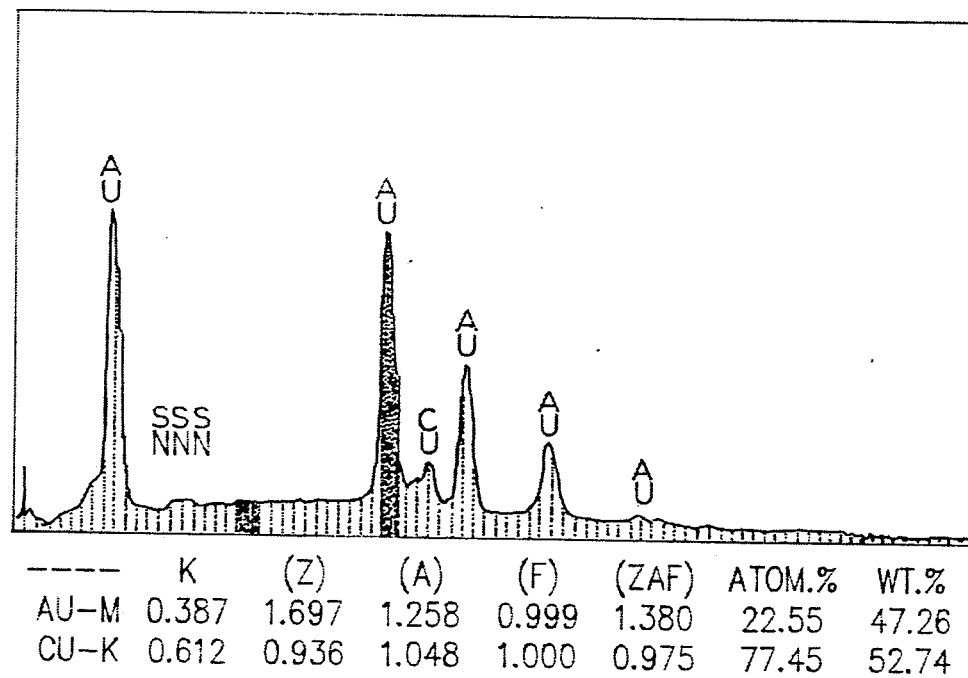
FIG. 10 is an Electron Dispersion Spectrum (EDS) of the center of the FIG. 9 image.

FIGS. 7 and 8 are the group A and group B samples laminated to Cu coupons plated with 3 microns of Au, respectively.

The continuity of the joined through holes can be measured, e.g., using Cu stitch patterns connecting the lands on the outmost layers. The stitch patterns can be etched off after measurement. The alignment can be achieved using the fiducials laser drilled in the individual layers.

The foregoing experiments showed that the AuSn20wt.% eutectic made by TLB could be used for land-to-land bonding simultaneously with high performance polymer-to high performance polymer bonding in the lamination of high density circuit boards. The technique makes it possible to achieve increased through hole density over known combinations of methods and materials.

The foregoing important features and advantages are only a few examples of such features and advantages, and are not intended to be exhaustive. Other such features, advantages and applications will be readily apparent to one of ordinary skill in the art to which the present invention pertains Also, the foregoing description is directed to one particular embodiment of the present invention, and various modifications and other embodiments of the present invention will be apparent to one of ordinary skill in the art to which the invention pertains. Therefore, while the present invention has been described in conjunction with a particular embodiment, it is to be understood that various modifications and other embodiments of the present invention may be made without departing from the scope of the present invention as described herein and as claimed in the appended claims.

What is claimed is:

1. An apparatus, comprising:
   at least a first dielectric layer including a through hole, containing electrically conductive material, terminating in a first electrically conductive land;
   at least a second dielectric layer including a second electrically conductive land, which second dielectric layer is laminated to said first dielectric layer; and
   means for electrically connecting said first and second lands, said means including a region of material having a composition which includes a metallic, non-eutectic alloy, essentially free of flux, said region of material having a melting point which is higher than the lamination temperature associated with said first and second dielectric layers.

2. The apparatus recited in claim 1, further comprising at least one semiconductor device mounted thereupon.

3. The apparatus recited in claim 1, wherein said region of material includes gold.

4. The apparatus recited in claim 1, wherein said region of material includes tin.

5. The apparatus recited in claim 1, wherein said apparatus is a printed circuit board.

6. An apparatus, comprising:
   at least a first dielectric layer including a first electrically conductive land;
   at least a second dielectric layer including a second electrically conductive land, which second dielectric layer is laminated to said first dielectric layer; and
   means for electrically connecting said first and second lands, said means including a region of material having a composition which includes a metallic, non-eutectic alloy, essentially free of flux, said region of material having a melting point which is higher than the lamination temperature associated with said first and second dielectric layers.

* * * * *

UNITED STATES PATENT AND TRADEMARK OFFICE
CERTIFICATE OF CORRECTION

PATENT NO. : 5,280,414

DATED : January 18, 1994

INVENTOR(S) : Davis et al

It is certified that error appears in the above-identified patent and that said Letters Patent is hereby corrected as shown below:

Drawings:

Figure 1 of the drawings should appear as per the attached Figure 1.

Signed and Sealed this

Third Day of January, 1995

*Attest:*

BRUCE LEHMAN

*Attesting Officer*     *Commissioner of Patents and Trademarks*